US007155017B2

(12) United States Patent
Kim et al.

(10) Patent No.: US 7,155,017 B2
(45) Date of Patent: Dec. 26, 2006

(54) SYSTEM AND METHOD FOR CONTROLLING AUDIO SIGNALS FOR PLAYBACK

(75) Inventors: Jong-Ho Kim, Seoul (KR); Ki-won Cho, Yongin (KR); Hae-Young Na, Seoul (KR); Keun-Chul Hong, Suwon (KR); Jong-Chul Shin, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 2 days.

(21) Appl. No.: 10/801,421

(22) Filed: Mar. 16, 2004

(65) Prior Publication Data

US 2005/0018856 A1 Jan. 27, 2005

(30) Foreign Application Priority Data

Jul. 22, 2003 (KR) .............................. 2003-50267

(51) Int. Cl.

| | |
|---|---|
| *H04R 29/00* | (2006.01) |
| *H04R 3/00* | (2006.01) |
| *H03G 11/00* | (2006.01) |
| *H03G 3/00* | (2006.01) |
| *H04B 3/00* | (2006.01) |

(52) U.S. Cl. ............................ 381/59; 381/55; 381/56; 381/58; 381/61; 381/96; 381/77

(58) Field of Classification Search .................. 381/58, 381/59, 103, 56, 96, 61, 111, 120, 91
See application file for complete search history.

(56) References Cited

U.S. PATENT DOCUMENTS

| | | | | |
|---|---|---|---|---|
| 4,980,920 | A * | 12/1990 | Noro et al. | 381/96 |
| 5,493,620 | A * | 2/1996 | Pulfrey | 381/96 |
| 6,028,944 | A * | 2/2000 | Markow et al. | 381/120 |
| 2002/0159602 | A1* | 10/2002 | Yoshino et al. | 381/59 |
| 2003/0128850 | A1* | 7/2003 | Kimura et al. | 381/82 |

FOREIGN PATENT DOCUMENTS

| | | |
|---|---|---|
| JP | 2003-125480 | 4/2003 |
| KR | 1020020048736 A | 6/2002 |

* cited by examiner

*Primary Examiner*—Laura A. Grier
(74) *Attorney, Agent, or Firm*—F. Chau & Assoc., LLC

(57) ABSTRACT

An apparatus and method for controlling a plurality of speakers, comprising an amplifier for amplifying and outputting a play signal to be played over the speakers; and at least one sensor disposed proximal to at least one of the speakers for sensing at least one environmental condition and outputting sensing data to a controller, wherein the controller adjusts the play signal to compensate for environmental changes based on the sensing data.

36 Claims, 4 Drawing Sheets

SYSTEM AND METHOD FOR CONTROLLING AUDIO SIGNALS FOR PLAYBACK

BACKGROUND OF THE INVENTION

1. Technical Field

The present invention relates to a system and method for controlling audio signals for playback over a plurality of speakers; more particularly, a system and method for controlling audio signals to optimize playback based on relative positions of the speakers and/or change in environmental conditions.

2. Discussion of Related Art

In entertainment facilities such as movie houses, sound studios, and concert halls, high quality audio and/or visual playback equipment is used to playback the audio or visual program to the audience. With advances in television technology and increased availability of large screen high definition televisions for use in homes, home theatre audio equipment have also increased in demand.

High quality audio reproduction or playback equipment includes a receiver for receiving audio signals from a device such as a DVD player which reads audio and visual information from an audio visual medium such as a DVD disc. The playback medium outputs the signals playback from the audio visual program to an amplifier for amplification and the amplified signals are output to speakers for audio playback. To faithfully reproduce recorded music or surround sound, speakers are strategically placed to reproduce different aspects of the sound track. For example in a home theatre audio playback system, speakers are designed differently if they are intended to be used as center speakers, side speakers or used as subwoofers. The center speaker is usually placed at front center of the viewing or listening area and side speakers are placed on the sides of the listening audience. If a speaker is disposed far from a location optimized for playback, the time of travel of the signal to be played over that speaker will result in audio playback that is sub-optimal. Environmental conditions such as temperature and humidity also affect speed of travel of audio signals. Thus, speakers placed in locations different from locations designed to be optimal will result in playback of an audio program. Also, even with speakers placed in locations designed for optimal audio playback, changes in environmental conditions such as temperature and humidity can also cause audio signals to arrive at times different from optimal, again causing suboptimal playback.

SUMMARY OF THE INVENTION

An apparatus for controlling a plurality of speakers, comprising an amplifier for amplifying and outputting a play signal to be played over the speakers; and at least one sensor disposed proximal to at least one of the speakers for sensing at least one environmental condition and outputting sensing data to a controller, wherein the controller adjusts the play signal to compensate for environmental changes based on the sensing data. The environmental conditions can be one of temperature and humidity.

The apparatus further including a detector disposed in each of the speakers configured for receiving a test signal originating from the controller and for reporting to the controller the test signal received at respective speakers, wherein the controller determines the relative positions of the speakers based on the test signals reported by the speakers.

Wherein the controller generates compensation data for adjusting the play signal for respective speakers based on the relative positions of the speakers.

The apparatus further including a memory for storing the compensation data.

The memory further stores sensing data read at the time of determination of the relative positions of the speakers. The memory is one of a register, an SRAM, a DRAM, and a flash memory.

The detector is an ultrasonic detector. Alternatively, the detector is a speaker used as a microphone. The relative position is determined based on the test signal received at a first one of the speakers and played by the first speaker and the played test signal is received by the other speakers.

According to an embodiment of the invention, the sensor is disposed in each of the speakers. According to another embodiment, the sensor is disposed in the controller.

A method of controlling a plurality of speakers is provided, comprising outputting from an amplifier a play signal to be played over the speakers; sensing by a sensor at least one environmental condition at a position proximal to at least one of the speakers and outputting sensing data to a controller; and adjusting the play signal to compensate for environmental changes based on the sensing data.

Wherein the sensor senses one of temperature and humidity.

The method further including determining relative positions of the speakers by receiving at each speaker a test signal originating from the controller; reporting to the controller the test signal received at respective speakers; and calculating relative positions of the speakers based on the test signals reported by the speakers.

The method further including generating compensation data for adjusting the play signal for respective speakers based on the relative positions of the speakers.

The method further including storing in a memory the compensation data.

The method further including storing sensing data read at the time of determination of the relative positions of the speakers.

The method wherein the memory is one of a register, an SRAM, a DRAM, and a flash memory.

The method wherein the step of receiving is performed by an ultrasonic detector.

The method wherein the step of receiving is performed by a speaker used as a microphone.

The method wherein the step of receiving is by a microphone.

The method wherein the relative position is determined based on the test signal received at a first one of the speakers and played by the first speaker and the played test signal is received by the other speakers.

The method wherein the sensor is disposed in each of the speakers.

The method wherein the sensor is disposed in the controller.

The method wherein the sensor senses temperature and humidity.

According to another embodiment of the invention, an apparatus is provided for controlling a plurality of speakers, comprising an amplifier for outputting an amplified play signal to be played over the speakers, a controller for originating a test signal for receipt by the plurality of speakers and for receiving return signals from each speaker, the return signals representing the test signals as received at each respective speaker, said controller for determining relative positions of the speakers based on the return signals and for generating compensation data based on the relative positions of the speakers, wherein the compensation data is used for adjusting the play signal.

The apparatus further including a detector disposed in each speaker for receiving the test signal. The detector is an ultrasonic detector. Alternatively, the detector is a speaker used as a microphone.

The apparatus further including at least one sensor disposed proximal to at least one of the speakers for sensing at least one environmental condition and outputting sensing data to the controller, wherein the controller adjusts the play signal to compensate for environmental changes based on the sensing data. The sensor senses one of temperature and humidity.

The apparatus further including a memory for storing the compensation data. The memory is one of a register, an SRAM, a DRAM, and a flash memory.

The relative position is determined based on the test signal received at a first one of the speakers and played by the first speaker and the played test signal is received by the other speakers.

BRIEF DESCRIPTION OF THE DRAWINGS

Embodiments of the present invention will be readily apparent when considered with the accompanying drawings.

DETAILED DESCRIPTION OF PREFERRED EMBODIMENTS

Figure 1:
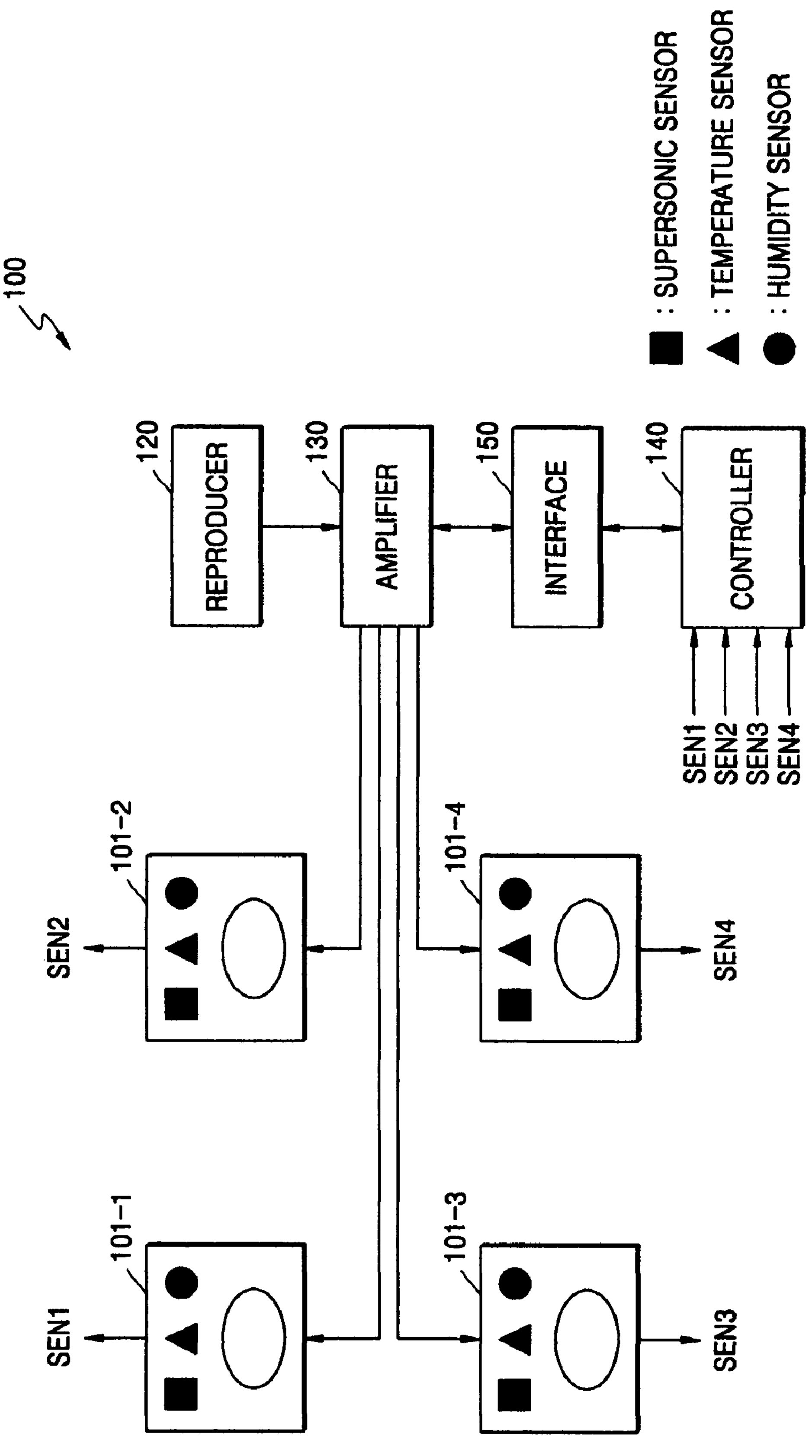
FIG. 1 shows a block diagram of an audio playback system according to an embodiment of the present invention.

Referring to FIG. 1, an audio playback system 100 includes a reproducer 120, controller 140, an amplifier 130, an interface 150, and a plurality of speakers 101-1~101-4. for receiving the amplified audio playback signals. The reproducer 120 is an audio playback medium such as a CD or a DVD player, or a signal received from a microphone (not shown). The audio signals from the reproducer 120 is amplified by amplifier 130 and forwarded to each of the speakers 101-1 to 101-4 for playback in the form of audible sound. Each of the speakers 101-1 to 101-4 includes environmental condition sensors for sensing environmental conditions such as temperature and humidity. The sensed environmental conditions from each speaker are reported as sensed data to controller 140, and the sensed data is analyzed by the controller 140 to determine if changes need to be made to the audio playback signal to compensate for the changed environmental conditions. According to this embodiment of the present invention, each of the speakers 101-1 to 101-4 includes a transceiver for transmitting and receiving signals. The sensed data is transmitted from the speakers to the controller 140 by the transceiver. Preferably, the transceiver is an ultrasonic transceiver which transmits and receives signals wirelessly. It is readily appreciated by one skilled in the art that data can be communicated to the controller 140 by other known means. One example is by wired connections.

According to a further embodiment of the present invention, the audio playback system 100 determines the relative distance of the speakers and the relative distance information is also used by the controller 140 to determine if changes need to be made to optimize playback.

Figure 2:
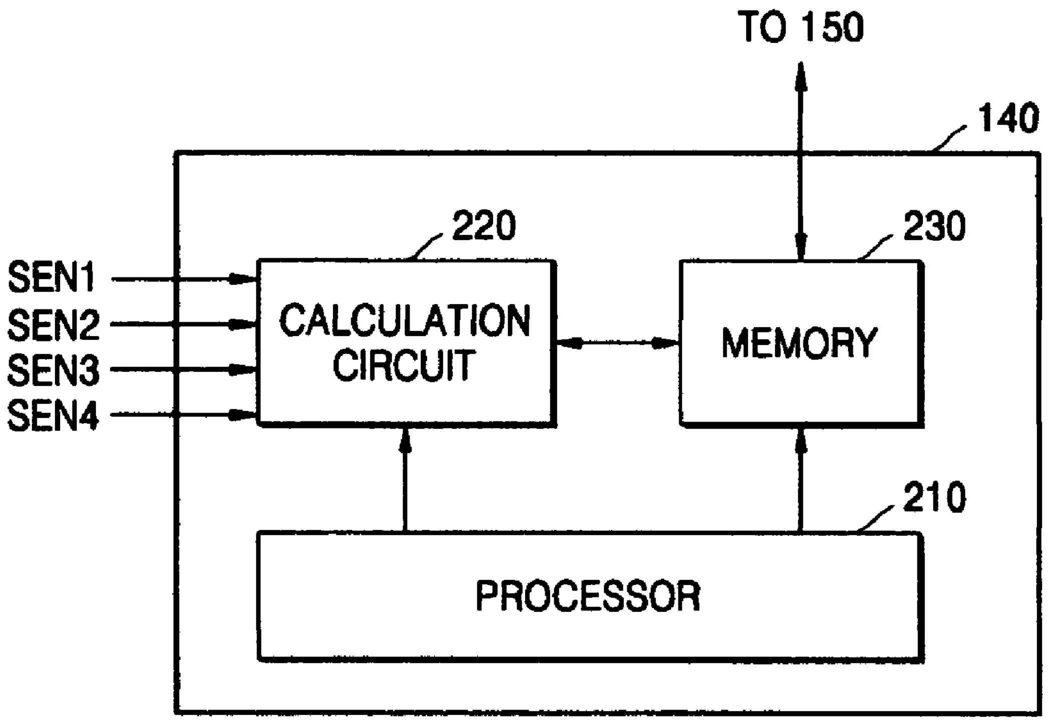
FIG. 2 shows a block diagram of a controller in the audio playback system of FIG. 1.

FIG. 2 shows a block diagram of the controller 140. Controller 140 includes a processor 210, a calculation circuit 220 and an associated memory 230. Memory 230 preferably includes a read only memory (ROM) or flash memory, registers, or RAMS. The ROM or flash memory is used for storing program codes executable by a processor 210 for interfacing the audio playback system 100 including the amplifier 150 and other functions including calculating relative positions of the speakers based on position data and controlling the playback signals based on position data or sensed data received from the sensors of the speakers. The registers or RAMs store data such as sensed data and position data from the speakers. The RAMs can be DRAMs or SRAMs. The processor 210 is preferably a digital signal processor (DSP) capable of processing digitized audio signals as well as handling functions of a CPU. The calculation circuit 220 receives the position data and sensed data from the speakers.

To determine relative position of the speakers, a test signal is sent to the first speaker 101-1. This test signal is in turn sent by speaker 101-1 to the other speakers 101-2 to 101-4. From the time of return of the test signal transmitted to speaker 101-1 from speakers 101-2 to 4, relative distance of speakers 101-2 to 4 from speaker 101 can be determined. For example, if the return signal for speaker 101-3 takes longer than speakers 101-2 and 101-4, speaker 101-3 has the largest distance or is the furthest away from speaker 101-1. The return signals (or positional data) from speakers 101-2 to 4 are forwarded to the controller 140. A program module stored in memory 230 is executed by processor 210 to determine the relative distance between the speakers based on the positional data. From such determination, controller 140 can make adjustments to the actual audio playback signals to compensate for differences in placement of the speakers from optimal positions. For example, if it is determined that speaker 101-3 is further from the optimal distance, the playback signal designated for speaker 101-3 is adjusted temporarily or in frequency or tone with compensating effect for the further distance.

According to an alternative embodiment of the invention, instead of using an ultrasonic transceiver, the test signal is played over speaker 101-1 and the played testing signal is received by the speakers of each of speakers 101-2 to 4. According to this embodiment, the speaker element of each of speakers 101-2 to 4 acts as a microphone for receiving the test signal. Upon receipt of the test signal, each of speakers 101-2 to 4 reports to controller 140 that it has received the test signal through amplifier 130. The controller 140 determines the relative distance between speaker 101-1 to each of speakers 101-2 to 4 based on the signals received from speakers 101-2 to 4. It is apparent to one skilled in the art that an actual microphone can also be used in the receiving speakers as the detector for detecting the test signal.

Referring to FIGS. 1 and 2, the controller 140 makes adjustments to audio playback signal by generating compensation data based on the positional data or time of arrival signals received from speakers 101-2 to 4. The compensation data is transmitted to the amplifier for changing the volumn, delay, phase, etc. of the signal to be forwarded to the speakers. The compensation data can be stored in memory 230 or can be forwarded directly to the amplifier 130. Additionally, the environmental sensors disposed in each of speakers 101 periodically reports sensed data, such as temperature and humidity, to the controller 140. The sensed data is stored in memory 230 of controller 140 and upon detection of a change in environmental conditions of a preset amount, such as 5° Fahrenheit, the controller 140 adjusts the audio playback signal to compensate for the changed environmental condition. For example, a change in temperature of 5° Fahrenheit may require an adjustment of 0.5 seconds in time for the signal designated for the speaker with the changed environmental condition.

Figure 3:
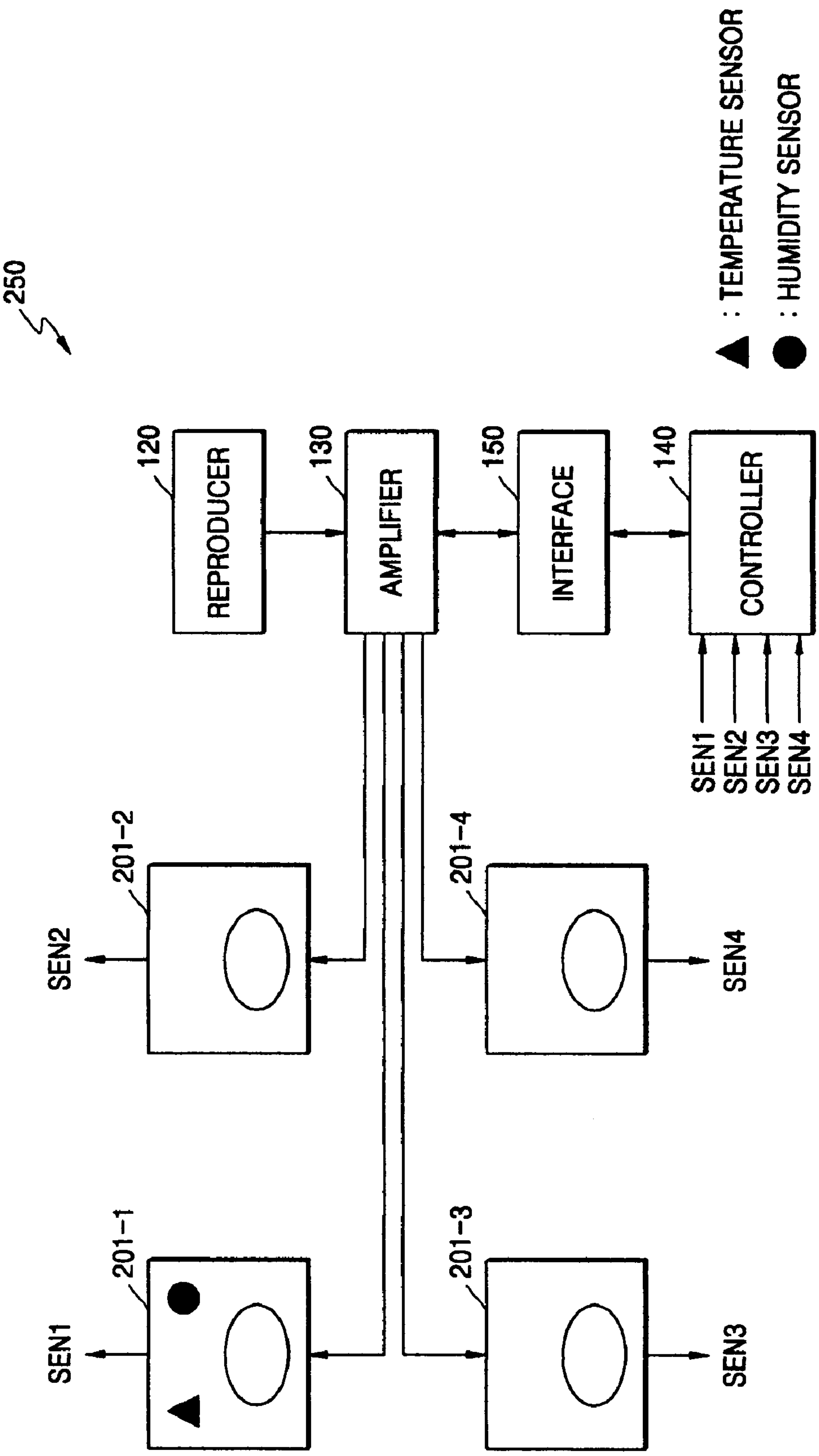
FIG. 3 shows an audio playback system according to another embodiment of the present invention.

FIG. 3 shows an alternative embodiment of an audio playback system of the present invention. According to this embodiment, instead of having environmental sensors in each of speakers 101-1 to 101-4, the environmental sensors are placed in only one of the speakers, for example at 201-1. The sensed signal is reported by the sensor(s) at speaker 201-1 to controller 140 and adjustments based on environmental conditions are made for all speakers 201-1 to 4. The audio playback system according to this embodiment is applicable to a system wherein speakers are placed in an area where the environmental conditions are essentially the same for all the speakers.

Figure 4:
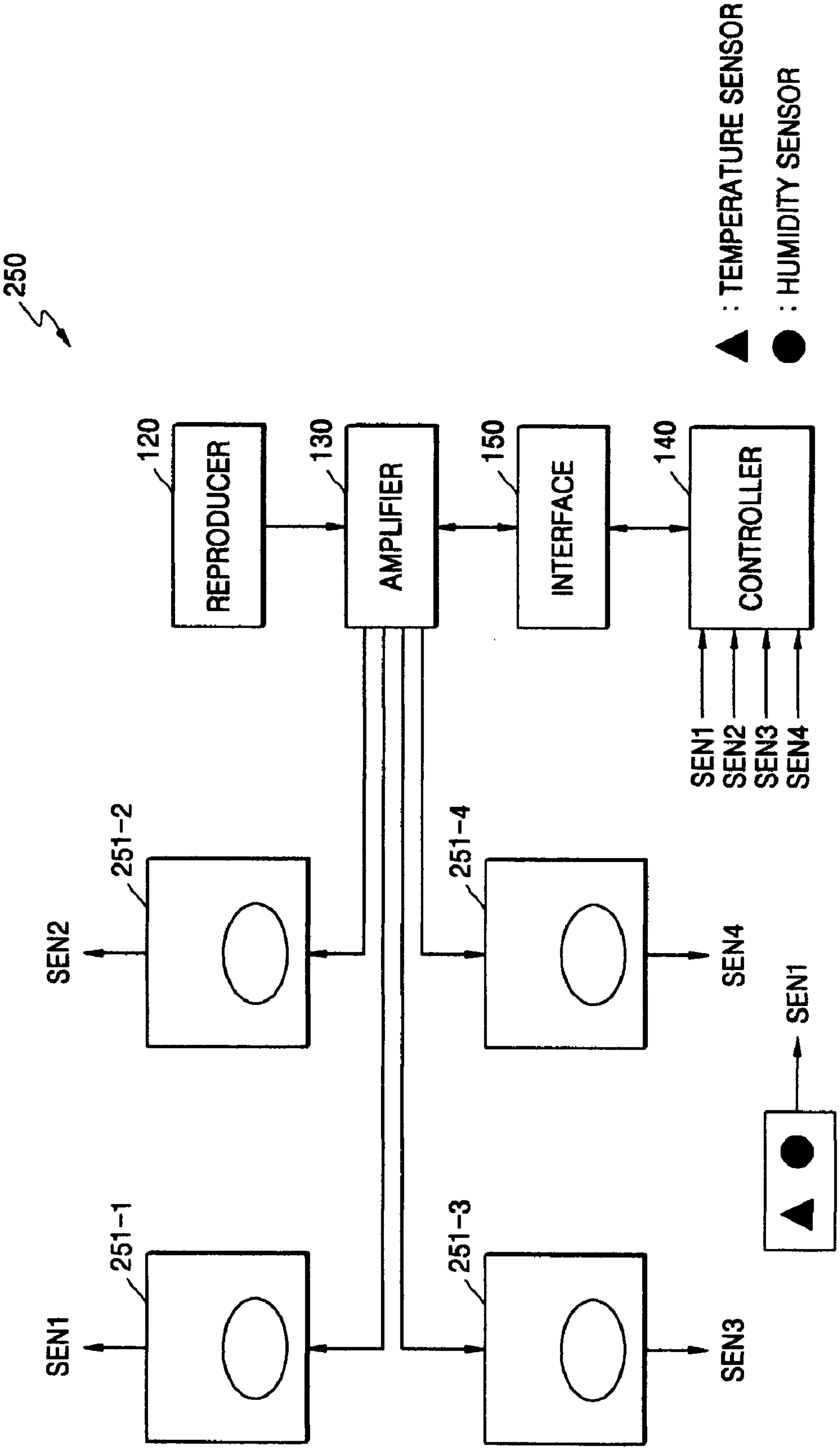
FIG. 4 shows still another embodiment of an audio playback system according to the present invention.

FIG. 4 shows still another embodiment of the present invention. According to this embodiment, the environmental sensors are not disposed in any of the speakers 251-1 to 251-4, but is disposed proximal to the speakers. The environmental sensors may also be placed at controller 140. The controller 140 makes adjustments to the audio playback signal based on the changed environmental conditions sensed by the environmental sensors.

While this invention has been particularly shown and described with reference to preferred embodiments thereof, it will be understood by those skilled in the art that various changes in form and details may be made therein without departing from the spirit and scope of the invention as defined by the appended claims.

The invention claimed is:

1. An apparatus for controlling a plurality of speakers to play in a multi-channel audio system, wherein the plurality of speakers are arranged at respective positions within a listening area, the apparatus comprising:

an amplifier for amplifying multi-channel audio signals to be played over the plurality of speakers;

at least one sensor that senses one of temperature and humidity and being disposed within the listening area proximal to at least one of the plurality of speakers for sensing at least one environmental condition of temperature or humidity and outputting sensed data to a controller; and a detector disposed in at least one of the plurality of speakers configured for receiving a test signal originating from the controller and for reporting to the controller the test signal received by at least one of plurality of speakers, wherein the controller determines the relative positions within the listening area of the plurality of speakers based on the test signal reported by at least one of the plurality of speakers, and wherein the controller adjusts an electrical characteristic of the multi-channel audio signals to compensate for environmental conditions in response to the sensed data from the sensors and on the determined relative positions of the plurality of speakers in the listening area.

2. The apparatus of claim 1, further including a memory for storing the sensed data.

3. The apparatus of claim 2, wherein the memory stores the sensed data read at the time of determination of the relative positions of the plurality of speakers.

4. The apparatus of claim 2, wherein the memory is one of a register, an SRAM, a DRAM, and a flash memory.

5. The apparatus of claim 1, wherein the detector is an ultrasonic detector.

6. The apparatus of claim 1, wherein the detector is a speaker used as a microphone.

7. The apparatus of claim 1, wherein the detector is a microphone.

8. The apparatus of claim 1, wherein the reported test signal is amplified by the amplifier prior to receipt by the controller.

9. The apparatus of claim 1, wherein the sensor is disposed in each of the speakers.

10. The apparatus of claim 1, wherein the sensor senses both temperature and humidity.

11. A method of controlling a plurality of speakers to play in a multi-channel audio system, wherein the plurality of speakers are arranged at respective positions within a listening area, the method comprising the steps of:

outputting from an amplifier an amplified multi-channel audio signal to be played over the plurality of speakers;

sensing by a sensor at least one environmental condition of temperature and humidity at a position within the listening area proximal to at least one of the plurality of speakers and outputting sensing data to a controller;

determining relative positions within the listening area of the plurality of speakers by;

receiving at at least one speaker a test signal originating from the controller;

reporting to the controller the test signal received at respective speakers the at least one speaker;

calculating relative positions of the plurality speakers based on the test signals reported by the speakers, wherein the sensor is disposed in the controller; and adjusting an electrical characteristic of the multi-channel audio signal to compensate for environmental conditions in response to the sensed data and on the determined relative positions of the plurality of sneakers in the listening area.

12. The method of claim 11, wherein the sensor senses both temperature and humidity.

13. The method of claim 11 further including storing in a memory the sensing data.

14. The method of claim 13, further including storing sensing data read at the time of determination of the relative positions of the speakers.

15. The method of claim 13, wherein the memory is one of a register, an SRAM, a DRAM, and a flash memory.

16. The method of claim 11, wherein the step of receiving is performed by a speaker used as a microphone.

17. The method of claim 11, wherein the step of receiving is by a microphone.

18. The method of claim 11, wherein the step of reporting to the controller the test signal is by wireless transmission.

19. The method of claim 11, wherein the sensor is disposed in the controller.

20. A method of controlling a plurality of speakers to play in a multi-channel audio system, wherein the plurality of speakers are arranged at respective positions within a listening area, the method comprising the steps of:

outputting from an amplifier an amplified multi-channel audio signal to be played over the plurality of speakers;

sensing by a sensor at least one environmental condition of temperature and humidity at a position within the listening area proximal to at least one of the plurality of speakers and outputting sensing data to a controller;

determining relative positions within the listening area of the plurality of speakers by:

receiving at at least one speaker a test signal originating from the controller;

reporting to the controller the test signal received at the at least one speaker;

calculating relative positions of the plurality of speakers based on the test signals reported by the speakers, wherein the step of receiving is performed by an ultrasonic; and adjusting an electrical characteristic of the multi-channel audio signal to compensate for environmental conditions in response to the sensed data and based on the determined relative positions of the plurality of speakers in the listening area.

21. The method of claim 20, wherein the relative position is determined based on the test signal received at a first one of the speakers and played by the first speaker and the played test signal is received by the other speakers.

22. The method of claim 20, wherein the sensor is disposed in each of the speakers.

23. The method of claim 20, wherein the sensor senses both temperature and humidity.

24. An apparatus for controlling a plurality of speakers arranged at respective positions within a listening area, comprising:

an amplifier for amplifying and outputting a multi-channel audio signal to be played over the speakers;

at least one sensor that senses a climate environment condition within the listening area and outputs sensed data; and a controller for originating a test signal for receipt by a detector at each of the plurality of speakers and for receiving return signals from each speaker, the return signals representing signals as received at each respective speaker in response to the test signal from a first speaker, said controller for determining relative positions of the plurality of speakers based on the return signals and for generating compensation data based on the sensed data from the sensor and the relative positions of the speakers, wherein the compensation data is used for adjusting at least one electrical characteristic of the multi-channel audio signal, wherein the detector is an ultrasonic detector.

25. The apparatus of claim 24, further including a detector disposed in each speaker for receiving the test signal.

26. The apparatus of claim 24, further including a memory for storing the sensing data.

27. The apparatus of claim 26, wherein the memory is one of a register, an SRAM, a DRAM, and a flash memory.

28. The apparatus of claim 24, wherein the relative position is determined based on the test signal received at a first one of the speakers and played by the first speaker and the played test signal is received by the other speakers.

29. An apparatus for controlling a plurality of speakers arranged at respective positions within a listening area, comprising:

an amplifier for amplifying and outputting a multi-channel audio signal to be played over the speakers;

a sensor that senses an environmental condition in the listening area being located proximal one of the plurality of speakers and that outputs sensing data; and a controller for originating a test signal for receipt by the plurality of speakers and for receiving return signals from each speaker, the return signals representing signals as received at each respective speaker in response to the test signal from a first speaker, said controller for determining relative positions of the speakers based on the return signals and for generating compensation data based on the relative positions of the speakers, wherein the controller adjusts an electrical characteristic of the multi-channel audio signal to compensate for environmental conditions based on the determined relative positions of the plurality of speakers and the sensing data, wherein the sensor senses the environmental conditions as one of temperature and humidity.

30. The apparatus of claim 29, wherein the detector is an ultrasonic detector.

31. The apparatus of claim 29, wherein the detector is a speaker used as a microphone.

32. The apparatus of claim 29, wherein the detector is a microphone.

33. The apparatus of claim 29, wherein the sensor is disposed in each of the speakers.

34. The apparatus of claim 29, wherein the sensor is disposed in the controller.

35. An apparatus for controlling a plurality of speakers arranged at relative positions in a listening area to play in a multi-channel audio system, comprising:

an amplifier for amplifying multi-channel audio signals to be played over the plurality of speakers;

at least one sensor disposed proximal to at least one of the speakers for sensing at least one climate environmental condition and outputting sensed data to a controller; and an ultrasonic detector disposed in each of the speakers configured for receiving a test signal originating from the controller and for reporting to the controller the test signal received at respective speakers, wherein the controller determines the relative positions of plurality of the speakers based on the test signals reported by the speakers, and wherein the controller adjusts electrical characteristics of the multi-channel audio signal to compensate for the environmental condition based on the sensed data and the determined relative positions of the plurality of speakers.

36. An apparatus for controlling a plurality of speakers, comprising:

an amplifier for amplifying and outputting a multi-channel signal to be played over the speakers;

and a controller for originating a test signal for receipt by the plurality of speakers and for receiving return signals from each speaker, the return signals representing signals as received at each respective speaker in response to the test signal from a first speaker, said controller for determining relative positions of the speakers based on the return signals and for generating compensation data based on the relative positions of the speakers, wherein the compensation data is used for adjusting the multi-channel signal; and at least one of the speakers for sensing at least one climate environmental condition and outputting sensing data to the controller, wherein the controller adjusts the play signal to compensate for environmental changes based on the sensing data, wherein the sensor is disposed in the controller.

* * * * *